(12) United States Patent
Beak et al.

(10) Patent No.: US 10,775,912 B2
(45) Date of Patent: Sep. 15, 2020

(54) DISPLAY DEVICE HAVING TOUCH SENSORS AND METHOD OF MANUFACTURING THE SAME

(71) Applicant: LG Display Co., Ltd., Seoul (KR)

(72) Inventors: Jung-Sun Beak, Paju-si (KR);
Seung-Hee Nam, Paju-si (KR);
Jung-Ho Bang, Paju-si (KR);
Seong-Joo Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/217,809

(22) Filed: Dec. 12, 2018

(65) Prior Publication Data

US 2019/0179440 A1  Jun. 13, 2019

(30) Foreign Application Priority Data

Dec. 13, 2017 (KR) ........................ 10-2017-0171289

(51) Int. Cl.
*G06F 3/041* (2006.01)
*G02F 1/1368* (2006.01)
(Continued)

(52) U.S. Cl.
CPC ............ *G06F 3/041* (2013.01); *G02F 1/1368* (2013.01); *G02F 1/13338* (2013.01);
(Continued)

(58) Field of Classification Search
CPC .... G06F 3/041; G06F 3/0412; G06F 3/04164; G06F 3/0443; G02F 1/13338;
(Continued)

(56) References Cited

U.S. PATENT DOCUMENTS 10,209,587 B2   2/2019  Wu
2015/0378486 A1  12/2015  Yu et al.
(Continued)

FOREIGN PATENT DOCUMENTS

CN         107024813 A       8/2017

OTHER PUBLICATIONS

Taiwan Intellectual Property Office, Office Action, TW Patent Application No. 107144755, dated Nov. 1, 2019, eight pages.

*Primary Examiner* — Robert J Michaud
(74) *Attorney, Agent, or Firm* — Fenwick & West LLP

(57) ABSTRACT

Disclosed is a display device having touch sensors which may reduce parasitic capacitance and a method of manufacturing the same. The display device includes a plurality of touch sensing lines respectively arranged so as to traverse a plurality of common electrode blocks forming an electric field with pixel electrodes, a lower planarization layer having openings in regions overlapping drain electrodes of thin film transistors, an upper planarization layer arranged between one of the pixel electrodes and the common electrode blocks, and the touch sensing lines so as to cover a side surface of the lower planarization layer, and an upper protective film arranged between the pixel electrodes and the common electrode blocks, and, thus, parasitic capacitance generated between the touch sensing lines and the common electrode blocks may be reduced without reduction in liquid crystal capacitance and storage capacitance.

20 Claims, 11 Drawing Sheets

(51) Int. Cl.
- *G02F 1/1343* (2006.01)
- *G02F 1/1333* (2006.01)
- *H01L 27/12* (2006.01)
- *G06F 3/044* (2006.01)
- G09G 3/3275 (2016.01)
- G09G 3/3266 (2016.01)
- G02F 1/1362 (2006.01)

(52) U.S. Cl.
CPC .... *G02F 1/13439* (2013.01); *G02F 1/134309* (2013.01); *G06F 3/0412* (2013.01); *G06F 3/0443* (2019.05); *G06F 3/04164* (2019.05); *H01L 27/1248* (2013.01); *H01L 27/1288* (2013.01); *G02F 1/136286* (2013.01); *G02F 2001/133357* (2013.01); *G02F 2001/134372* (2013.01); *G06F 2203/04103* (2013.01); *G09G 3/3266* (2013.01); *G09G 3/3275* (2013.01); *H01L 27/124* (2013.01)

(58) Field of Classification Search
CPC ........... G02F 1/134309; G02F 1/13439; G02F 1/1368; H01L 27/1248; H01L 27/1288
See application file for complete search history.

(56) References Cited

U.S. PATENT DOCUMENTS

| | | |
|---|---|---|
| 2016/0291746 A1 | 10/2016 | Kim |
| 2016/0320882 A1 | 11/2016 | Kim et al. |
| 2017/0177159 A1* | 6/2017 | Cao ........................ G06F 3/0412 |
| 2018/0348584 A1* | 12/2018 | Wu .................... G02F 1/136227 |
| 2018/0358562 A1* | 12/2018 | Takita .................. C07D 333/76 |

* cited by examiner

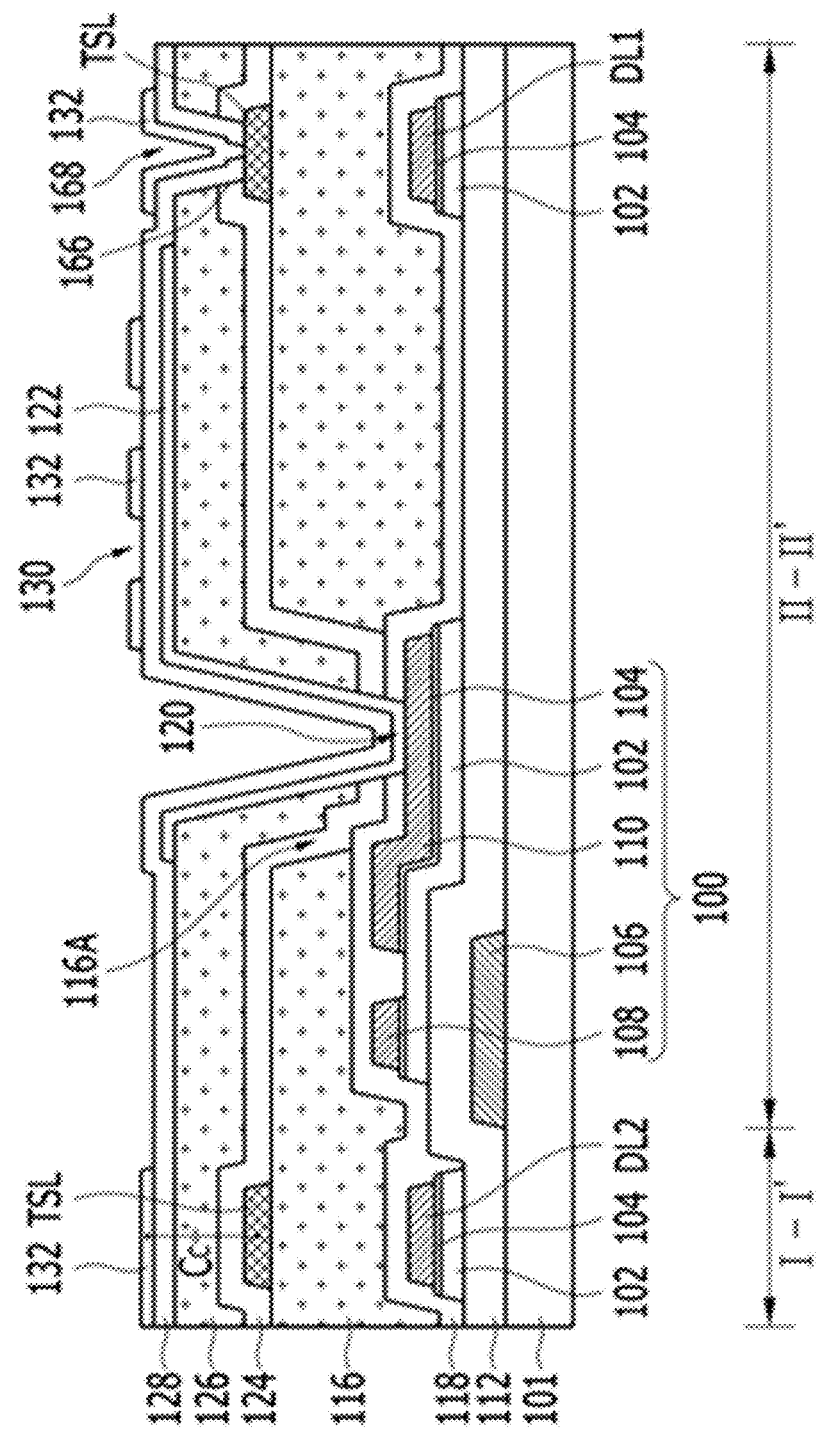

DISPLAY DEVICE HAVING TOUCH SENSORS AND METHOD OF MANUFACTURING THE SAME

CROSS-REFERENCE TO RELATED APPLICATIONS

This application claims the benefit of the Republic of Korea Patent Application No. 10-2017-0171289, filed on Dec. 13, 2017, which is hereby incorporated by reference in its entirety.

BACKGROUND

Technical Field

The present disclosure relates to a display device and a method of manufacturing the same, and more particularly, to a display device having touch sensors which may reduce parasitic capacitance and a method of manufacturing the same.

Discussion of the Related Art

A touch panel is one kind of input device which is provided in a display device, such as a liquid crystal display device, an organic light emitting display device or an electrophoretic display device, so that a user may input information by directly contacting a screen using a finger or a stylus pen.

Recently, in order to satisfy slimness of portable terminals, such as smartphones, tablet PCs, etc., demand for a display device, in which touch sensors constituting a touch panel are installed within a display panel of the display device, is increasing.

However, in such a display device having built-in touch sensors, a plurality of electrodes or signal lines of a display panel are arranged around the touch sensors. Unnecessary parasitic capacitances are formed due to these electrodes or signal lines of the display panel. The parasitic capacitances increase a touch driving load and lower accuracy in touch sensing, or, in severe cases, may cause impossibility of sensing touch.

SUMMARY

Accordingly, the present disclosure is directed to a display device having touch sensors and a method of manufacturing the same that substantially obviates one or more problems due to limitations and disadvantages of the related art.

An object of the present disclosure is to provide a display device having touch sensors which may reduce parasitic capacitance and a method of manufacturing the same.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display device having touch sensors includes a plurality of touch sensing lines respectively arranged so as to traverse a plurality of common electrode blocks forming an electric field with pixel electrodes, a lower planarization layer having openings in regions overlapping drain electrodes of thin film transistors, and an upper planarization layer arranged between one of the pixel electrodes and the common electrode blocks, and the touch sensing lines so as to cover a side surface of the lower planarization layer.

Some embodiments relate to a display device having touch sensors comprising: a plurality of thin film transistors arranged on a substrate; a plurality of pixel electrodes, each of the plurality of pixel electrodes connected to a corresponding one of the plurality of thin film transistors; a plurality of common electrode blocks configured to form an electric field with the plurality of pixel electrodes, the plurality of common electrodes arranged on the substrate; a plurality of touch sensing lines, each of the plurality of touch sensing lines connected to a corresponding one of the plurality of common electrode blocks; a lower protective film arranged between the plurality of thin film transistors and the plurality of touch sensing lines, the lower protective film having a plurality of openings overlapping drain electrodes of the plurality of thin film transistors; a lower planarization layer arranged on the lower protective film, the lower planarization layer having a plurality of openings overlapping the plurality of openings of the lower protective film; an upper planarization layer arranged between one of the plurality of pixel electrodes and the plurality of common electrode blocks, and the plurality of touch sensing lines, wherein side surfaces of the upper planarization layer cover side surfaces of the lower planarization layer exposed by the plurality of openings of the lower planarization layer, and wherein the side surfaces of the upper planarization layer, the plurality of openings in the lower planarization layer, and the plurality of openings in the lower protective film form pixel contact holes that expose the drain electrodes of the plurality of thin film transistors; and an upper protective film arranged between the pixel electrodes and the common electrode blocks, wherein the plurality of pixel electrodes contact side surfaces of the upper planarization layer and the lower protective film exposed by the pixel contact holes.

Some embodiments relate to a method of manufacturing a display device having touch sensors, comprising: forming a plurality of thin film transistors on a substrate; forming a lower protective film so as to cover the plurality of thin film transistors, the lower protective film having a plurality of openings overlapping drain electrodes of the plurality of thin film transistors; forming a lower planarization layer on the lower protective film, the lower planarization layer having a plurality of openings overlapping the openings of the lower protective film; forming a plurality of touch sensing lines on the lower planarization layer; forming an upper planarization layer on the plurality of touch sensing lines and the lower planarization layer, wherein side surfaces of the upper planarization layer cover side surfaces of the lower planarization layer exposed by the plurality of openings of the lower planarization layer, and wherein the side surfaces of the upper planarization, the plurality of openings in the lower planarization layer, and the plurality of openings in the lower protective film form pixel contact holes that expose the drain electrodes of the plurality of thin film transistors; forming a plurality of pixel electrodes, each of the plurality of pixel electrodes connected to a corresponding one of the plurality of thin film transistors through side surfaces of the pixel contact holes; forming an upper protective film on the upper planarization layer and the plurality of pixel electrodes; and forming a plurality of common electrode blocks configured to form an electric field with the plurality of pixel electrodes, each of the plurality of common electrode blocks arranged on the upper protective film to be connected to a corresponding one of the plurality of touch sensing lines.

Some embodiments relate to a display device having touch sensors comprising: a substrate; a thin film transistor (TFT) arranged on the substrate, wherein the TFT includes an electrode; a first protective film on the TFT, the first protective film including a hole that exposes a portion of an electrode of the TFT; a first planarization layer over the first protective film and the TFT, the first planarization layer including a hole overlapping the portion of the electrode exposed through the hole in the first protective film; a touch sensing line (TSL) on the lower planarization layer; a second planarization layer over the TSL and the first planarization layer, the second planarization layer covering a side surface of the first planarization layer exposed by the hole in the first planarization layer such that a hole is formed in the second planarization layer; a pixel electrode on the second planarization layer, the pixel electrode electrically connected to the electrode of the TFT through the hole in the second planarization layer, the hole in the first planarization layer, and the hole in the first protective film; and a common electrode block over the pixel electrode the common electrode block electrically connected to the TSL.

It is to be understood that both the foregoing general description and the following detailed description of the present disclosure are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings:

FIG. 4 is a cross-sectional view of the display panel, taken along lines "I-I'" and "II-II'" of FIG. 3.

DETAILED DESCRIPTION

Reference will now be made in detail to the preferred embodiments of the present disclosure, examples of which are illustrated in the accompanying drawings.

Figure 1:
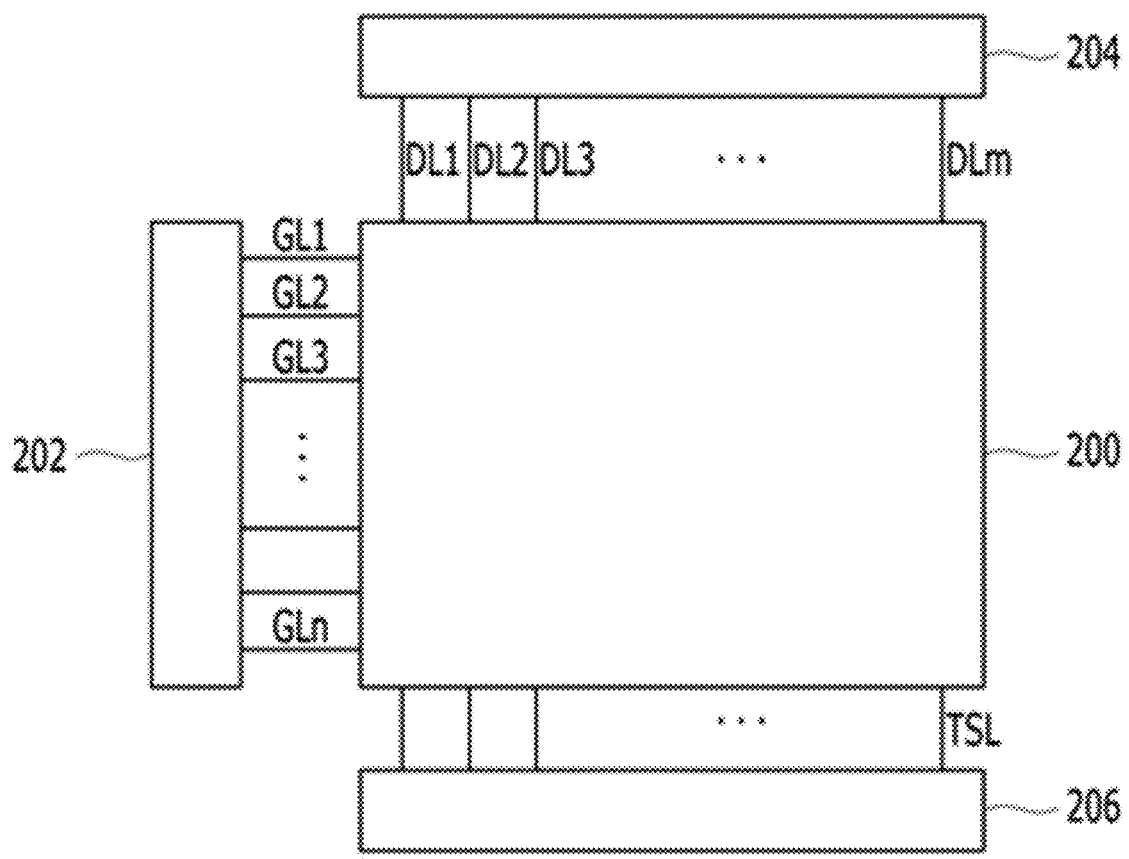
FIG. 1 is a block diagram illustrating a display device having touch sensors in accordance with an embodiment.

FIG. 1 is a block diagram illustrating a display device having touch sensors in accordance with one embodiment of the present disclosure.

The display device shown in FIG. 1 includes a data driver 204, a gate driver 202, a touch driver 206, and a display panel 200.

The data driver 204 converts data from a timing controller (not shown) into analog data voltage and supplies the analog data voltage to data lines DL in response to a data control signal from the timing controller.

The gate driver 202 sequentially drives gate lines GL of the display panel 200 in response to a gate control signal from the timing controller. The gate driver 202 supplies a scan pulse of a gate-on voltage to each gate line GL during a scan period of the corresponding gate line GL, and supplies a gate-off voltage to the corresponding gate line GL during remaining periods when other gate lines GL are driven. The gate driver 202 is formed together with thin films transistors of respective pixels during a process of manufacturing the thin film transistors and is located at a non-display area formed at one side or both sides of a substrate of the display panel 200.

The touch driver 206 is connected to touch sensing lines TSL of the display panel 200 and thus receives a user touch signal from the touch sensing lines TSL. The touch driver 206 detects whether or not user touch occurs and a touch position by sensing change in capacitance due to the user touch.

In the display panel 200, a plurality of pixels are arranged in a matrix and thus displays an image. If a liquid crystal panel is used as the display panel 200, the display panel 200 may include a color filter substrate on which a color filter array is formed, a thin film transistor substrate on which a thin film transistor array is formed, and a liquid crystal layer provided between the color filter substrate and the thin film transistor substrate.

Figure 2:
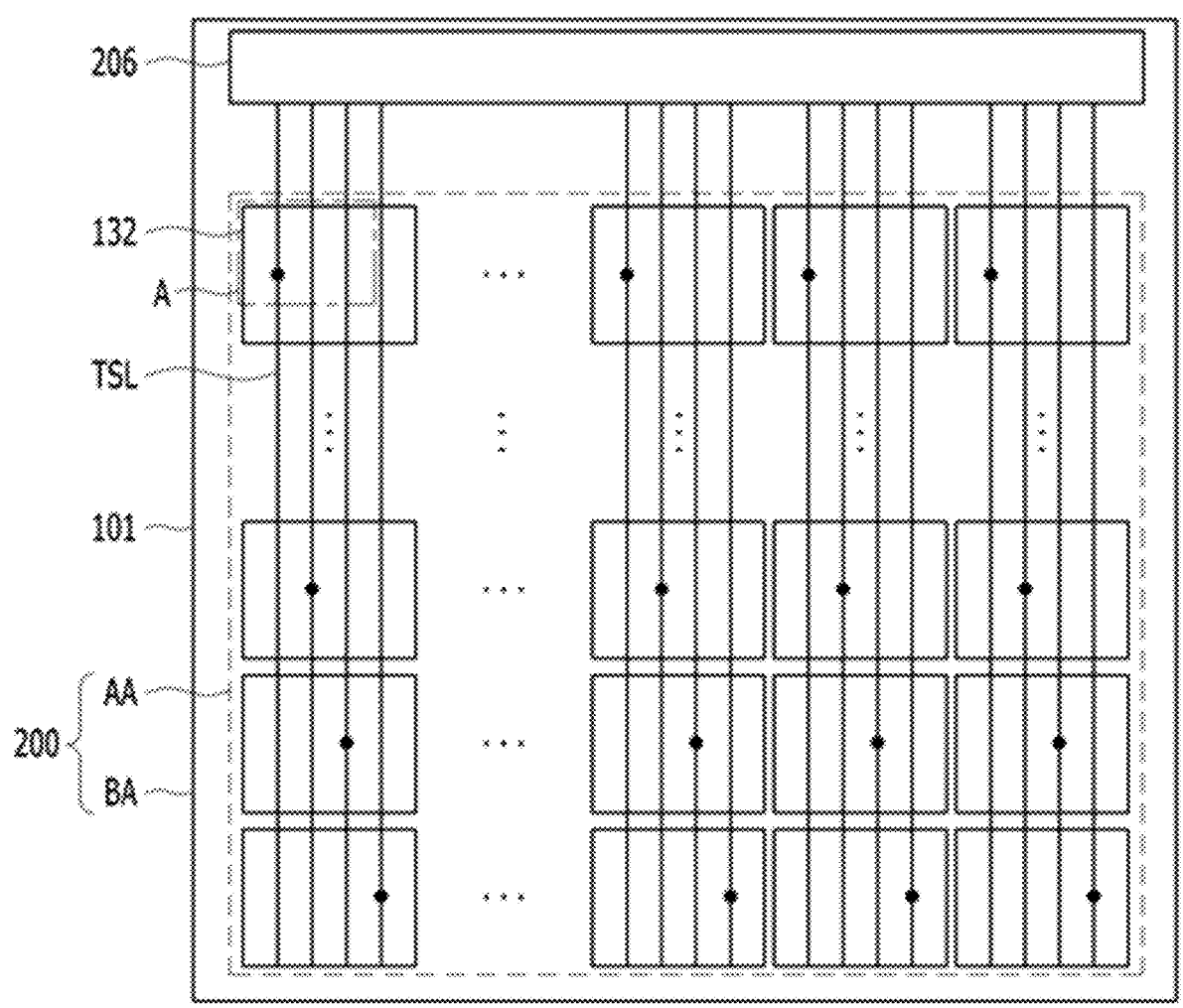
FIG. 2 is a plane view illustrating a display panel having the touch sensors shown in FIG. 1 in more detail, according to an embodiment.

The display panel 200 includes an active area AA and a bezel area BA arranged at at least one side of the active area AA, as exemplarily shown in FIG. 2.

A plurality of pads connected to the signal lines GL, DL and TSL of the active are AA are arranged in the bezel area BA. That is, gate pads (not shown) connected to the gate lines GL, data pads (not shown) connected to the data lines DL and common pads (not shown) connected to the touch sensing lines TSL are arranged in the bezel area BA. Further, at least one of the gate driver 202, the data driver 204, or the touch driver 206 may be arranged in the bezel area BA.

A plurality of common electrode blocks 132 and a plurality of touch sensing lines TSL respectively connecting the common electrode blocks 132 to the touch driver 206 are arranged in the active area AA. Here, each touch sensing line TSL is arranged so as to extend in a vertical or horizontal direction and thus to traverse the common electrode blocks 132. For example, the touch sensing lines TSL may be arranged so as to extend in a direction parallel to the data lines DL and thus to traverse the common electrode blocks 132, which are arranged in the direction of the data lines DL.

In the example of FIG. 2, a plurality of the common electrode blocks 132 are arranged in a first direction parallel to the gate lines GL and in a second direction parallel to the data lines DL. The common electrode blocks 132 may also be arranged so as to be spaced apart from each other.

The common electrode blocks 132 are formed by dividing a common electrode of the display device into a plurality of pieces. The common electrode blocks 132 can operate as common electrodes during an image display period, and can operate as touch electrodes during a touch sensing period. That is, during the image display period, the common electrode blocks 132 receive a common voltage supplied through the touch sensing lines TSL. Further, during the touch sensing period (e.g., an image non-display period) the common electrode blocks 132 supply sensed touch sensing voltages to the touch driver 206 through the touch sensing lines TSL.

Each of the common electrode blocks 132 can have a size corresponding to at least two pixel areas in consideration of a user touch area. Therefore, one common electrode block 132 may be arranged so as to overlap a plurality of pixel electrodes 122, as exemplarily shown in FIG. 3.

The pixel electrode 122 is connected to a thin film transistor 100 in each pixel area, prepared by intersection of the gate line GL and the data line DL, as exemplarily shown in FIG. 4.

The thin film transistor 100 charges the pixel electrode 122 with a data signal of the data line DL in response to a scan signal of the gate line GL (not shown in FIG. 4) and maintains the charged state of the pixel electrode 122. For this purpose, the thin film transistor 100 includes a gate electrode 106 connected to the gate line GL, a source electrode 108 connected to the data line DL, a drain electrode 110 connected to the pixel electrode 122, and a semiconductor layer formed on a gate insulating film 112 so as to form a channel between the source electrode 108 and the drain electrode 110. Here, the semiconductor layer includes an active layer 102 and an ohmic contact layer 104. The active layer 102 is formed on the gate insulating film 112 so as to overlap the gate electrode 106, thus forming the channel between the source and drain electrodes 108 and 110. The ohmic contact layer 104 is formed on the active layer 102 except for the channel so as to form ohmic contact between each of the source and drain electrodes 108 and 110 and the active layer 102. The active layer 102 and the ohmic contact layer 104 are formed to overlap the data line DL as well as the source and drain electrodes 108 and 110.

A lower protective film 118, a lower planarization layer 116, an interlayer protective film 124, an upper planarization layer 126, and an upper protective film 128 are sequentially stacked on the thin film transistor 100.

Each of the lower protective film 118, the interlayer protective film 124 and the upper protective film 128 is formed to have a monolayer or multilayer structure using an inorganic insulating material, such as $SiN_x$, SiON, or $SiO_2$. Particularly, if the active layer 102 is formed of an oxide semiconductor, the lower protective film 118 contacting the active layer 102 may be formed of silicon oxide ($SiO_x$) having a lower hydrogen content than silicon nitride ($SiN_x$) grown as a film using hydrogen gas. Therefore, diffusion of hydrogen into the active layer 102 during formation of the lower protective film 118 may be prevented and thus a change in a threshold voltage of the thin film transistor 100 may be prevented. Further, the interlayer protective film 124 can be formed of silicon nitride ($SiN_x$) and may thus prevent oxidation of the touch sensing lines TSL.

Each of the lower planarization layer 116 and the upper planarization layer 126 can be formed of a photosensitive organic insulating material so as not to require an etching process. For example, the lower planarization layer 116 and the upper planarization layer 126 is formed of a photoacryl, parylene, or siloxane-based organic insulating materials. Here, the lower planarization layer 116 has an opening 116A in a region overlapping the drain electrode 110 of the thin film transistor 100. The upper planarization layer 126 and the interlayer protective film 124 are arranged to cover the side surface of the lower planarization layer 116 exposed through the opening 116A. Thereby, a pixel contact hole 120 formed through the upper planarization layer 126, the interlayer protective film 124 and the lower protective film 118 is arranged within the opening 116A so as to have a smaller line width than that of the opening 116A. Since the interlayer protective film 124 and the lower protective film 118 are self-aligned under the upper planarization layer 126 between the upper planarization layer 126 and the drain electrode 110 around the pixel contact hole 120, only the interlayer protective film 124 and the lower protective film 118 are arranged between the upper planarization layer 126 and the drain electrode 110 around the pixel contact hole 120.

As such, in the present disclosure, the lower protective film 118 formed of an inorganic insulating material is arranged between the thin film transistor 100 and the lower planarization layer 116 formed of an organic insulating material, and the interlayer protective film 124 formed of an inorganic insulating material is arranged between the touch sensing line TSL and the upper planarization layer 126 formed of an organic insulating material. The lower protective film 118 and the interlayer protective film 124 formed of inorganic insulating materials can have excellent adhesive strength with the thin film transistor 100 and the touch sensing line TSL, as compared to the lower and upper planarization layers 116 and 126 formed of organic insulating materials. Therefore, separation of the lower protective film 118 and the interlayer protective film 124 from the upper surfaces of the thin film transistor 100 and the touch sensing line TSL may be prevented and, thus, oxidation of the thin film transistor 100 and the touch sensing line TSL may be prevented.

The pixel electrode 122 is conductively connected to the drain electrode 110 exposed through the pixel contact hole 120 formed through the lower protective film 118, the interlayer protective film 124 and the upper planarization layer 126. The pixel electrode 122 directly contacts the side surface of each of the lower protective film 118, the interlayer protective film 124 and the upper planarization layer 126, exposed through the pixel contact hole 120.

Here, the side surface of the upper planarization layer 126 formed of an organic insulating material and the side surfaces of the lower protective film 118 and the interlayer protective film 128 formed of inorganic insulating materials are exposed through the same pixel contact hole 120. Therefore, the present disclosure may minimize the number of necessary pixel contact holes 120 and, thus, reduce an area occupied by the pixel contact holes 120 and improve an aperture ratio.

The common electrode block 132 is formed on the upper protective film 128 of each pixel area so as to have a plurality of slits 130. The common electrode block 132 overlaps the pixel electrode 122 with the upper protective film 128 disposed between each pixel area and thus forms a fringe field. Thereby, during the image display period, a common voltage is supplied to the common electrode block 132, the common electrode block 132 to which the common voltage is supplied, forms the fringe field with the pixel electrode 122 to which a pixel voltage signal is supplied, and, thus, liquid crystal molecules arranged between the thin film transistor substrate and the color filter substrate are rotated by dielectric anisotropy. Further, light transmissivity of the pixel area is varied according to a degree of rotation of the liquid crystal molecules and, thus, gradation is implemented.

Further, the common electrode blocks 132 serve as touch electrodes which sense a user's touch position during the touch sensing period, e.g., the image non-display period.

Figure 3:
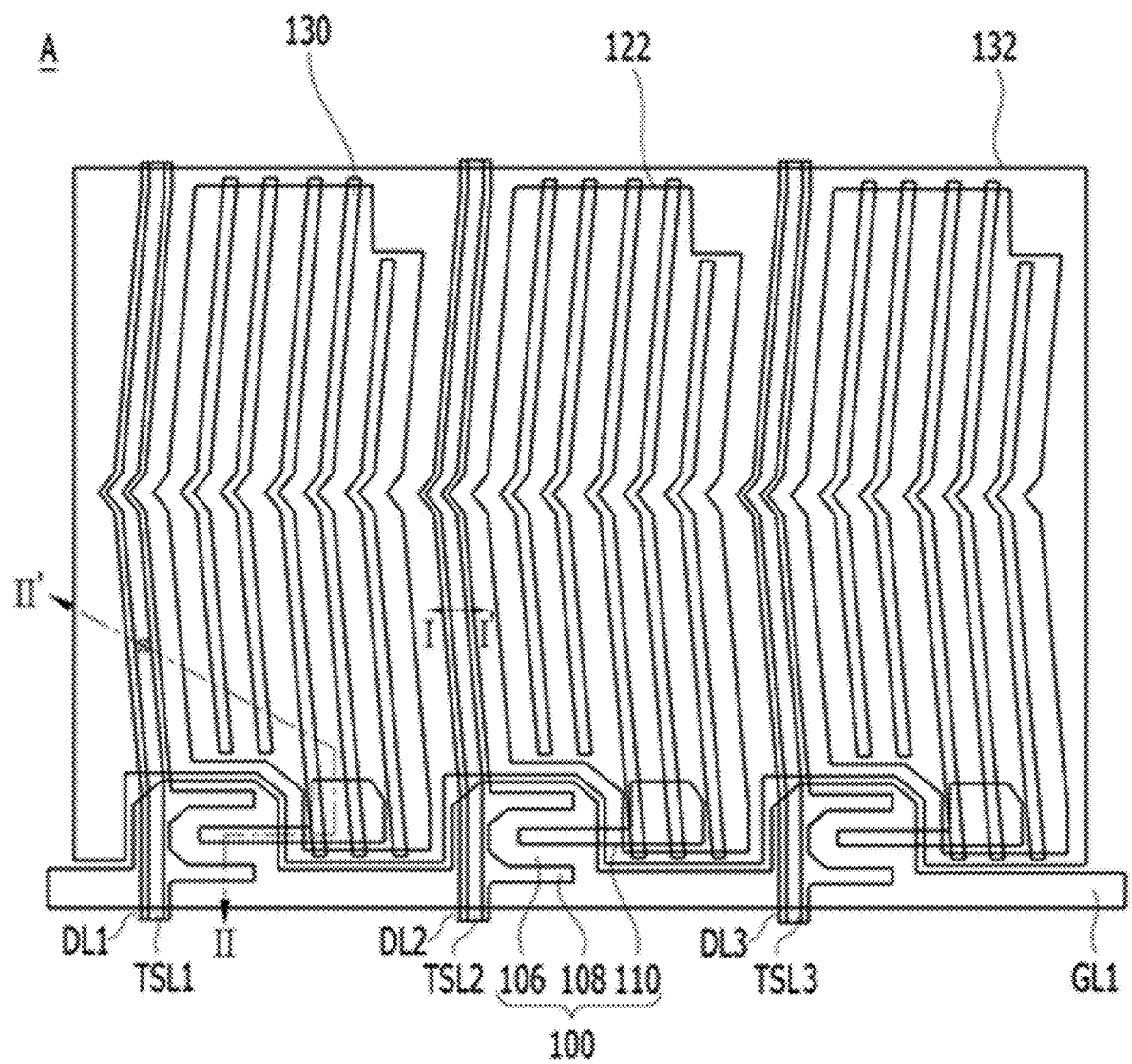
FIG. 3 is an enlarged plan view of a portion "A" of FIG. 2, according to an embodiment.

For this purpose, each common electrode block 132 is connected to one of the touch sensing lines TSL traversing the common electrode block 132. For example, the common electrode block 132 shown in FIG. 3 is connected to a first touch sensing line TSL1 out of first to third touch sensing lines TSL1, TSL2, and TSL3 (not shown in FIG. 3). In more detail, the touch sensing line TSL is arranged on the lower planarization layer 116, exposed through a first touch contact hole 166 formed through the interlayer protective film 124 and the upper planarization layer 126 and a second touch contact hole 168 formed through the upper protective film 128, and connected to the common connection electrode 162 arranged on the upper protective film 128.

Each common electrode block 132 is not connected to the remaining touch sensing lines TSL except for one of the touch sensing lines TSL traversing the common electrode block 132. For example, the common electrode block 132 shown in FIG. 3 is not connected to the second and third touch sensing lines TSL2 and TSL3 except for the first touch sensing line TSL1 out of the first to third touch sensing lines TSL1, TSL2 and TSL3. In more detail, out of the touch sensing lines TSL traversing each common electrode block 132, the remaining touch sensing lines TSL which are not connected to the common electrode block 132 overlap the common electrode block 132 with the interlayer protective film 124 formed of an inorganic insulating material, the upper planarization layer 126 formed of an organic insulating material, and the upper protective film 128 formed of an inorganic insulating material, disposed between. Therefore, a distance between the touch sensing lines TSL and the common electrode blocks 132 is increased by the thickness of the upper planarization layer 126 formed of an organic insulating material and, thus, parasitic capacitance Cc generated between the touch sensing lines TSL and the common electrode blocks 132 may be reduced. A touch driving load may be reduced as much as such a reduction in the parasitic capacitance Cc and thus accuracy in touch sensing may be improved.

As such, in the present disclosure, the common electrode block 132 and the pixel electrodes 122 are spaced apart from each other with the upper protective film 128, formed of an inorganic insulating material, disposed between, and the touch sensing lines TSL and the common electrode block 132 are spaced apart from each other with the interlayer protective film 124 and the upper protective film 128, formed of inorganic insulating materials, and the upper planarization layer 126, formed of an organic insulating material, disposed between. Therefore, in the present disclosure, parasitic capacitance generated between the touch sensing lines TSL and the common electrode blocks 132 may be reduced without reduction in liquid crystal capacitance and storage capacitance generated between the common electrode blocks 132 and the pixel electrodes 122.

FIGS. 5A to 5G are cross-sectional views illustrating a method of manufacturing the display device shown in FIG. 4, according to an embodiment.

Figure 5A:
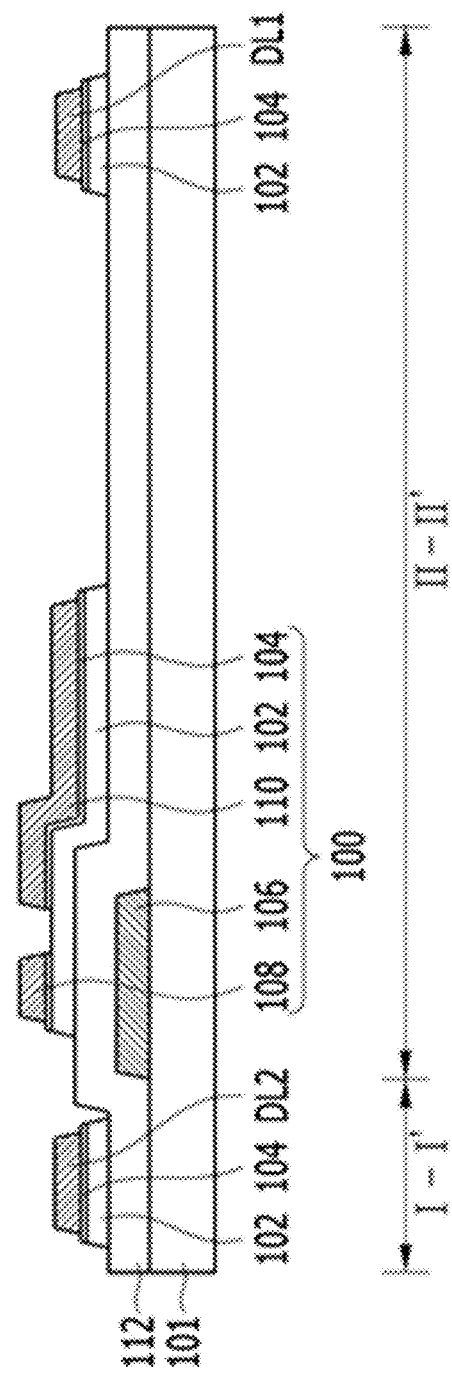
FIGS. 5A to 5G are cross-sectional views illustrating a method of manufacturing the display device shown in FIG. 4.

With reference to FIG. 5A, the data lines DL and the thin film transistors 100 are formed on a substrate 101 through at least two mask processes.

In more detail, a gate metal layer is deposited on the entire upper surface of the substrate 101 and then patterned, thus forming the gate electrodes 106. Thereafter, the gate insulating film 112 is formed by coating the entire surface of the substrate 101 provided with the gate electrodes 106 formed thereon with an inorganic insulating material. A semiconductor material and a data metal layer are sequentially stacked on the gate insulating film 112 and then patterned, thus forming the active layer 102, the ohmic contact layer 104, the source and drain electrodes 108 and 110 and the data lines DL.

Figure 5B:
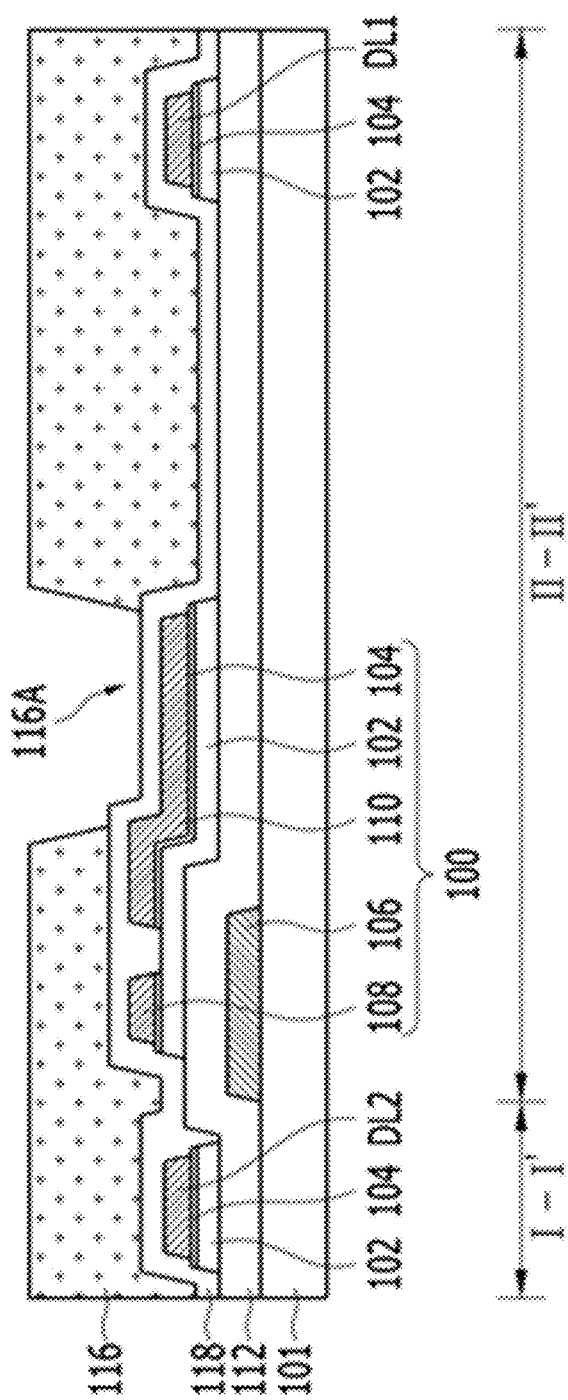

With reference to FIG. 5B, the lower protective film 118 and the lower planarization layer 116 are sequentially formed on the substrate 101 provided with the data lines DL and the thin film transistors 100 formed thereon.

In more detail, the lower protective film 118 is formed by stacking an inorganic insulating material on the entire upper surface of the substrate 101 provided with the data lines DL and the thin film transistors 100 formed thereon. Here, the lower protective film 118 uses an inorganic insulating material, such as $SiN_x$, SiON, or $SiO_2$. Thereafter, an organic insulating material is coated on the entire upper surface of the lower protective film 118 and then patterned through a photolithographic process, thus forming the lower planarization layer 116 having the openings 116A. The lower planarization layer 116 uses a photoacryl, parylene, or siloxane-based organic insulating material. The openings 116A overlap the drain electrodes 110 of the thin film transistors 100.

Figure 5C:
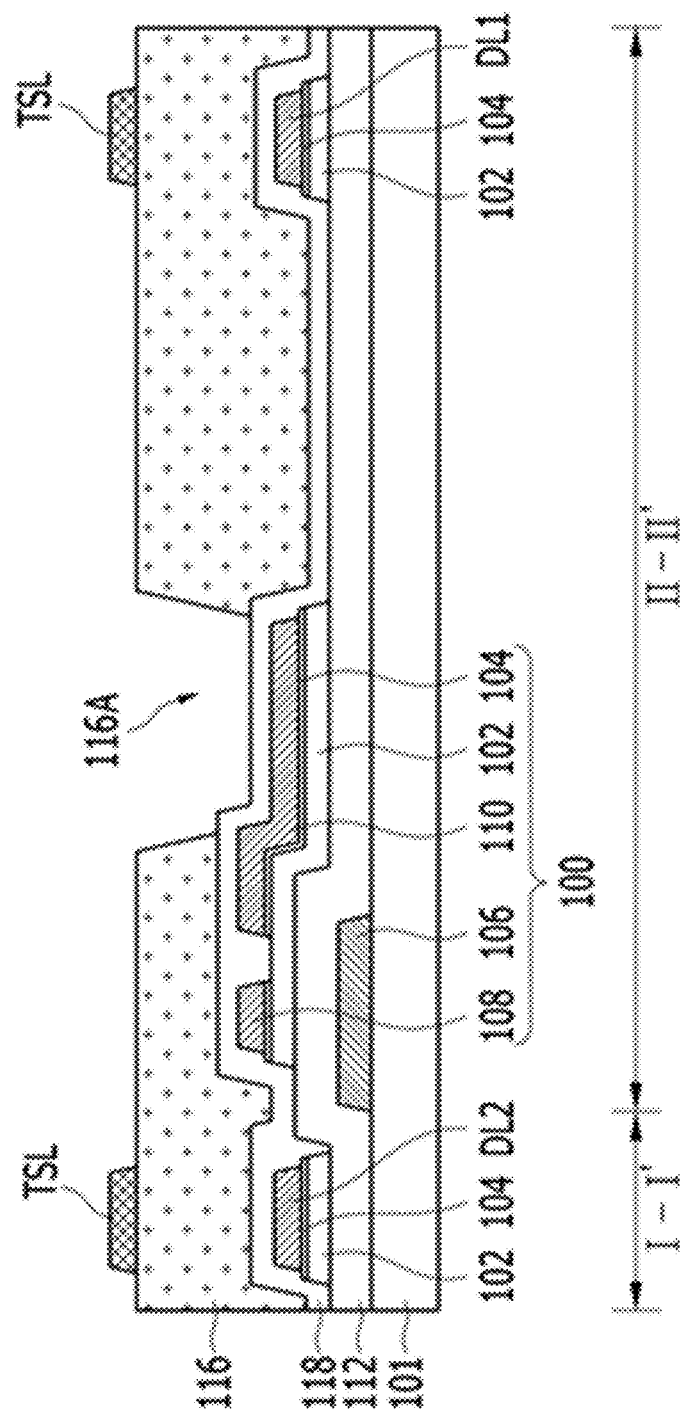

With reference to FIG. 5C, the touch sensing lines TSL are formed on the substrate 101 provided with the lower planarization layer 116 formed thereon.

An opaque conductive layer is deposited on the entire upper surface of the substrate 101 provided with the lower planarization layer 116 formed thereon and is then patterned through a photolithographic process and an etching process. Thereby, the touch sensing lines TSL are formed on the lower planarization layer 116. Here, the touch sensing lines TSL are formed of an opaque conductive layer so as to have a monolayer or multilayer structure using at least one metal selected from the group consisting of Al, Ti, Cu, Mo, Ta and MoTi.

Figure 5D:
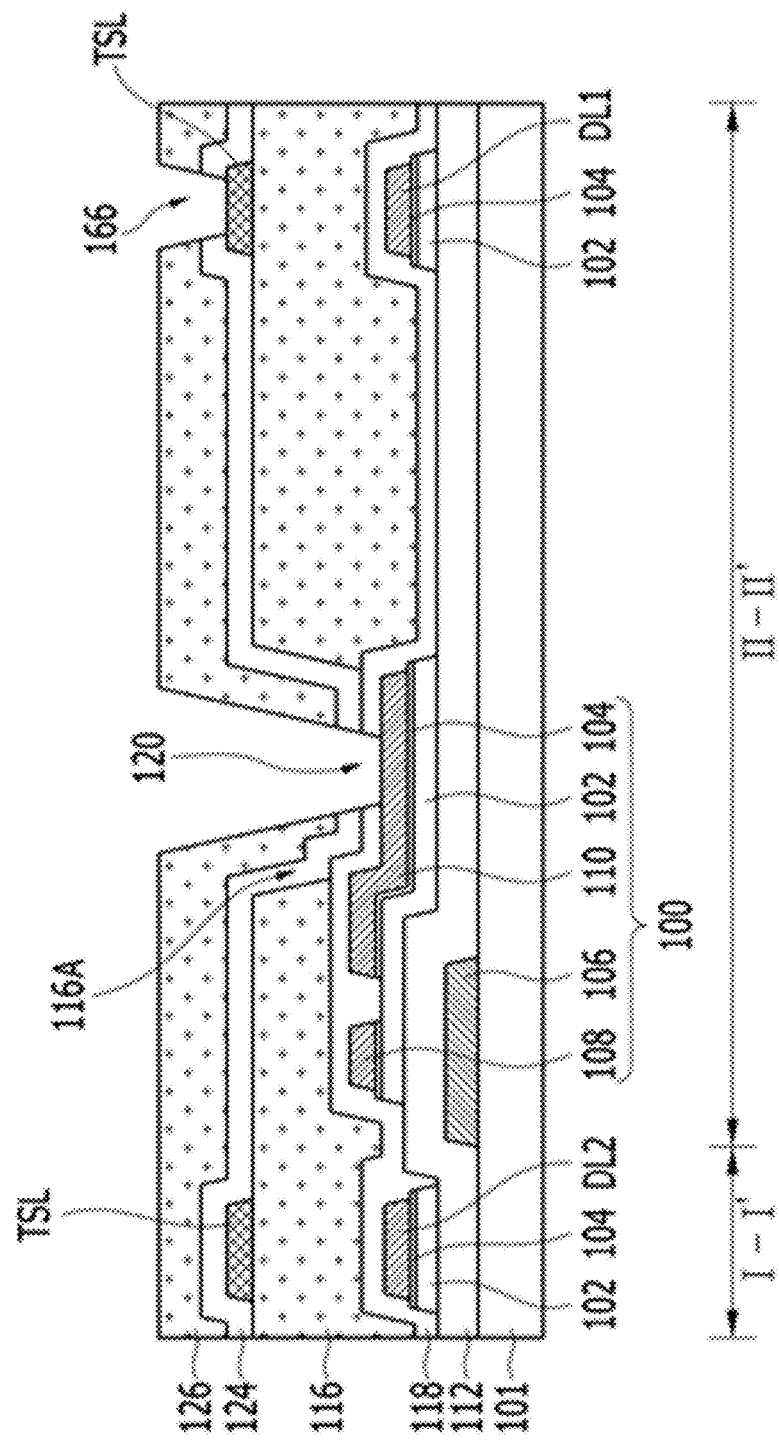

With reference to FIG. 5D, the interlayer protective film 124 and the upper planarization layer 126 are formed on the substrate 101 provided with the touch sensing lines TSL formed thereon.

In more detail, the interlayer protective film 124 is formed by depositing an inorganic insulating material on the entire upper surface of the substrate 101 provided with the touch sensing lines TSL formed thereon. Here, the interlayer protective film 124 uses an inorganic insulating material, such as $SiN_x$, SiON, or $SiO_2$. Thereafter, the upper planarization layer 126 is formed by depositing an organic insulating material on the entire upper surface of the interlayer protective film 124. The upper planarization layer 126 uses a photoacryl, parylene, or siloxane-based organic insulating material. The upper planarization layer 126 is patterned through a photolithographic process, thus forming the pixel contact holes 120 and the first touch contact holes 166. Thereafter, the interlayer protective film 124 and the lower protective film 118 are etched through an etching process using the upper planarization layer 126 as a mask. Thereby, the pixel contact holes 120 are formed through the upper planarization layer, the interlayer protective film 124, and the lower protective film 118 and thus expose the drain electrodes 110. Furthermore, the first touch contact holes 166 are formed through the upper planarization layer 126 and the interlayer protective film 124 and thus expose the touch sensing lines TSL.

Figure 5E:
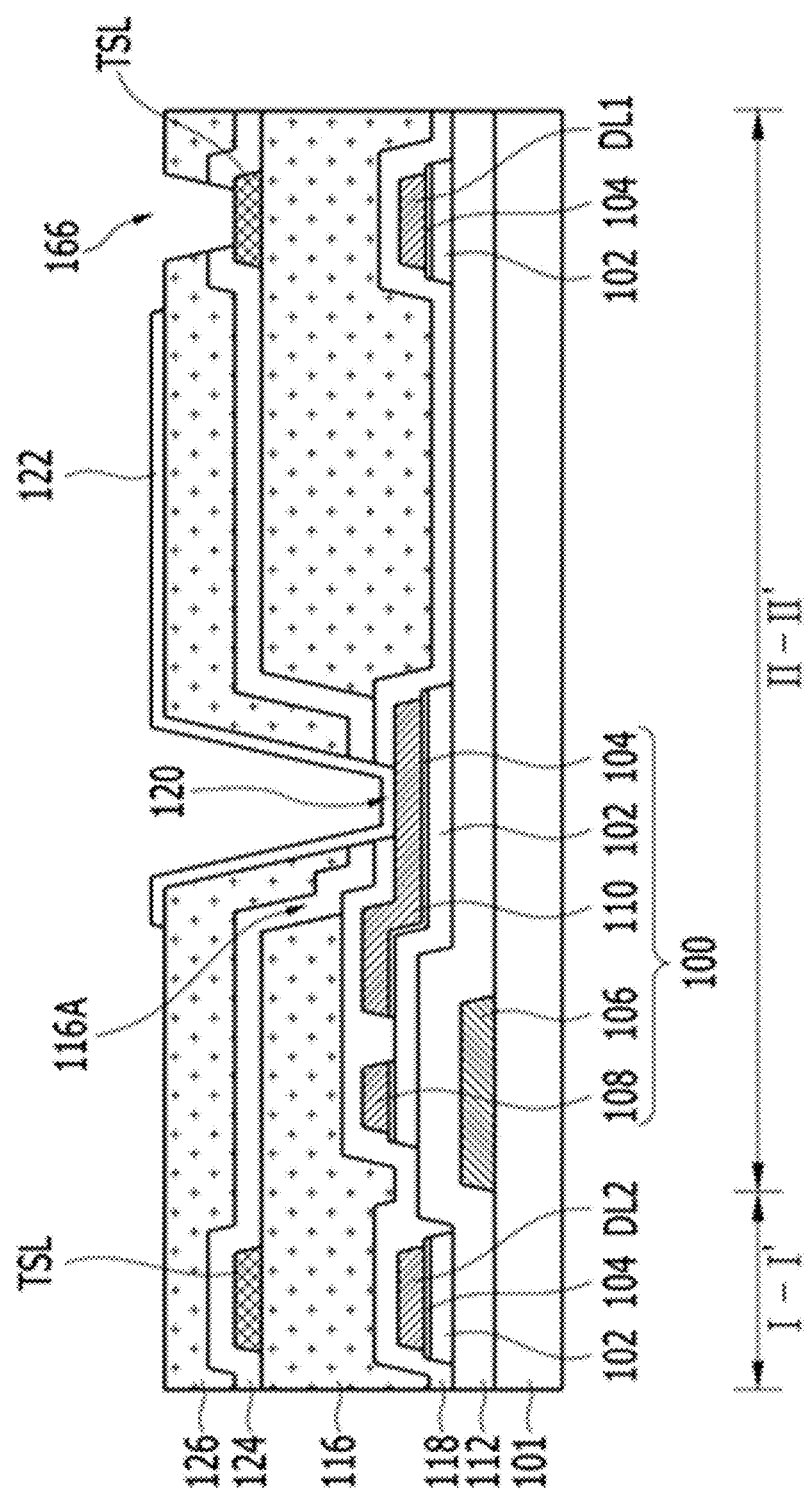

With reference to FIG. 5E, the pixel electrodes 122 are formed on the substrate 101 provided with the interlayer protective film 124 and the upper planarization layer 126 formed thereon.

In more detail, a transparent conductive layer is deposited on the entire upper surface of the substrate 101 provided with the upper planarization layer 126 formed thereon. Thereafter, the transparent conductive layer is patterned through a photolithographic process and an etching process, thus forming the pixel electrodes 122.

Figure 5F:
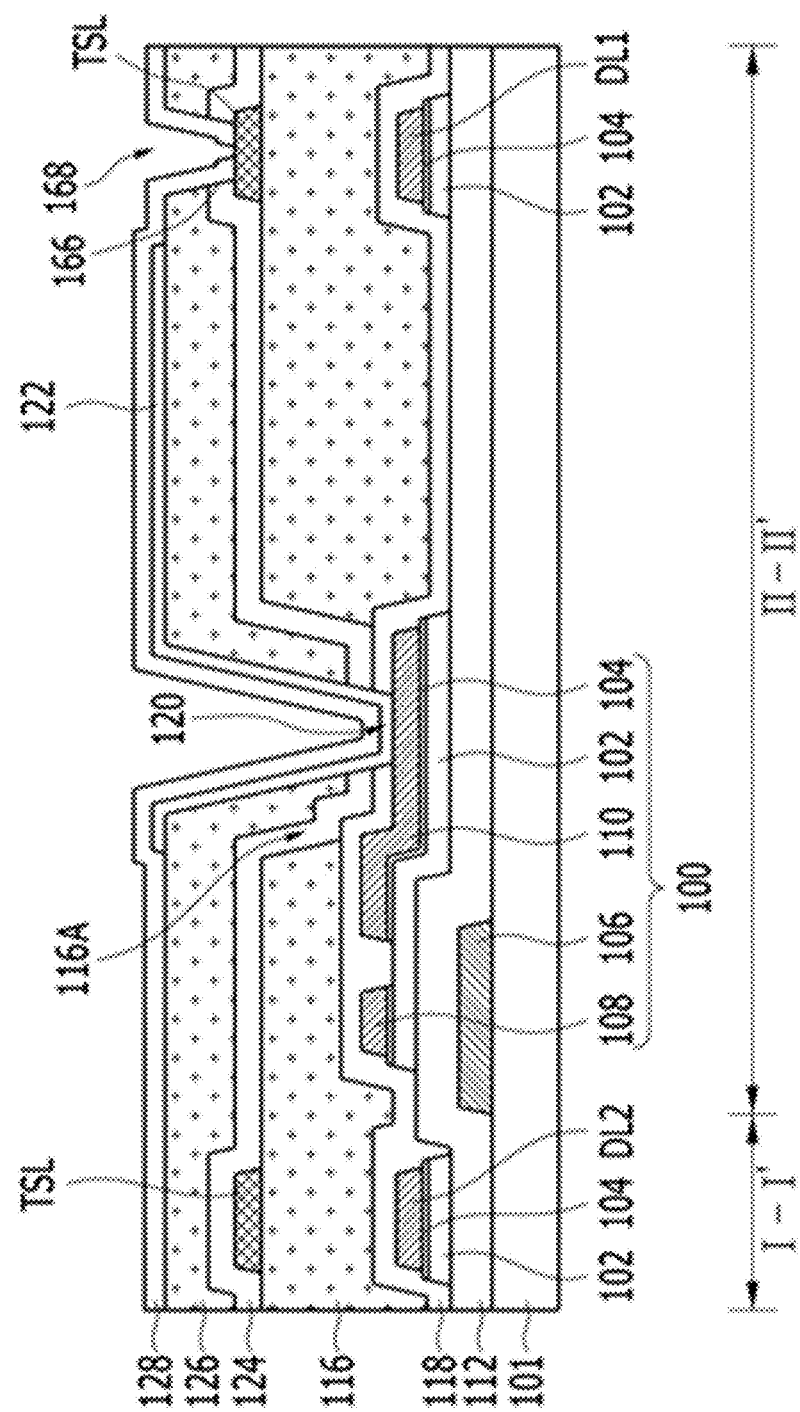

With reference to FIG. 5F, the upper protective film 128 having the second touch contact holes 168 is formed on the substrate 101 provided with the pixel electrodes 122 formed thereon.

In more detail, the upper protective film 128 using an inorganic insulating material, such as $SiN_x$, SiON, or $SiO_2$, is formed on the entire surface of the substrate 101 provided with the pixel electrodes 122 formed thereon. Thereafter, the upper protective film 128 is patterned through a photolithographic process and an etching process, thus forming the second touch contact holes 168 exposing the touch sensing lines TSL.

Figure 5G:
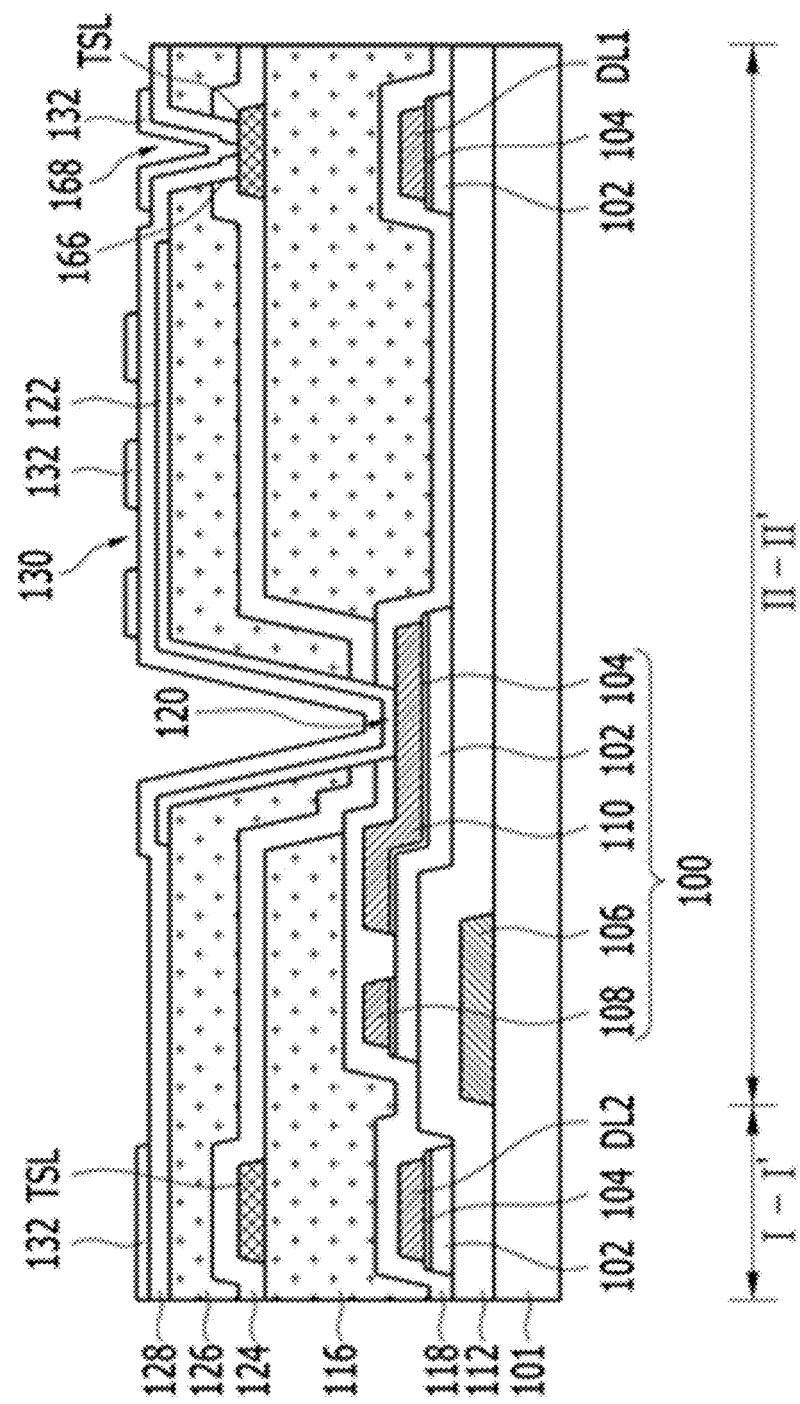

With reference to FIG. 5G, the common electrode blocks 132 are formed on the substrate 101 having the second touch contact holes 168.

In more detail, a transparent conductive film is deposited on the entire upper surface of the substrate 101 having the second touch contact holes 168. Thereafter, the transparent conductive layer is patterned through a photolithographic process and an etching process, thus forming the common electrode blocks 132.

Although the present disclosure exemplarily describes a structure in which the pixel electrodes 122 are arranged below the common electrode blocks 132, the common electrode blocks 132 may be arranged below the pixel electrodes 122.

As apparent from the above description, in a display device having touch sensors in accordance with the present disclosure, common electrode blocks and pixel electrodes are spaced apart from each other with an upper protective film formed of an inorganic insulating material, disposed between, and touch sensing lines and the common electrode blocks are spaced apart from each other with an interlayer protective film and the upper protective film formed of inorganic insulating materials and an upper planarization layer formed of an organic insulating material, disposed between. Therefore, in the present disclosure, parasitic capacitance generated between the touch sensing lines and the common electrode blocks may be reduced without reduction in liquid crystal capacitance and storage capacitance generated between the common electrode blocks and the pixel electrodes. Further, in the present disclosure, the side surface of the upper planarization layer formed of an organic insulating material and the side surfaces of a lower protective film and the interlayer protective film formed of inorganic insulating materials are exposed through the same pixel contact hole and, thus, the pixel electrode is conductively connected to a drain electrode exposed through one pixel contact hole. Therefore, the display device in accordance with the present disclosure may minimize the number of necessary pixel contact holes and, thus, reduce an area occupied by the pixel contact holes and improve an aperture ratio. Moreover, in the present disclosure, the pixel contact holes formed through the lower protective film and the interlayer protective film are formed using the upper planarization layer as a mask and, thus, a manufacturing process of the display device may be simplified and manufacturing costs of the display device may be reduced.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A display device having touch sensors comprising:
a plurality of thin film transistors arranged on a substrate;
a plurality of pixel electrodes, each of the plurality of pixel electrodes connected to a corresponding one of the plurality of thin film transistors;
a plurality of common electrode blocks configured to form an electric field with the plurality of pixel electrodes, the plurality of common electrodes arranged on the substrate;
a plurality of touch sensing lines, each of the plurality of touch sensing lines connected to a corresponding one of the plurality of common electrode blocks;
a lower protective film arranged between the plurality of thin film transistors and the plurality of touch sensing lines and arranged on drain electrodes of the plurality of thin film transistors, the lower protective film having a plurality of openings overlapping the drain electrodes of the plurality of thin film transistors;
a lower planarization layer arranged on the lower protective film, the lower planarization layer having a plurality of openings overlapping the plurality of openings of the lower protective film;
an upper planarization layer arranged between the plurality of touch sensing lines and one of the plurality of pixel electrodes and the plurality of common electrode blocks, wherein side surfaces of the upper planarization layer cover side surfaces of the lower planarization layer exposed by the plurality of openings of the lower planarization layer, and wherein the side surfaces of the upper planarization layer, the plurality of openings in the lower planarization layer, and the plurality of openings in the lower protective film form pixel contact holes that expose the drain electrodes of the plurality of thin film transistors; and
an upper protective film arranged between the pixel electrodes and the common electrode blocks and arranged on the upper planarization layer,
wherein the plurality of pixel electrodes contacts side surfaces of the upper planarization layer and the lower protective film exposed by the pixel contact holes.

2. The display device according to claim 1, further comprising:
an interlayer protective film arranged between the plurality of touch sensing lines and the upper planarization layer, the interlayer protective film having a plurality of openings overlapping the plurality of openings of the lower protective film,
wherein side surfaces of the upper planarization layer, the plurality of openings of the interlayer protective film, and the plurality of openings of the lower protective film form the pixel contact holes.

3. The display device according to claim 2, wherein each of the upper planarization layer and the lower planarization layer comprises an organic insulating material, and each of the lower protective film, the interlayer protective film, and the upper protective film comprises an inorganic insulating material.

4. The display device according to claim 2, wherein:
one of the plurality of touch sensing lines that traverses each of the plurality of common electrode blocks is exposed through a touch contact hole formed through the interlayer protective film, the upper planarization layer, and the upper protective film and is connected to a corresponding one of the plurality of common electrode blocks; and
a remainder of the plurality of touch sensing lines traverses the corresponding one of the plurality of common electrode blocks by overlapping the corresponding common electrode block with the interlayer protective film, the upper planarization layer, and the upper protective film disposed between the remainder of the plurality of touch sensing lines and the corresponding common electrode block.

5. The display device according to claim 3, wherein:
one of the plurality of touch sensing lines that traverses each of the plurality of common electrode blocks is exposed through a touch contact hole formed through the interlayer protective film, the upper planarization layer, and the upper protective film and is connected to a corresponding one of the plurality of common electrode blocks; and
a remainder of the plurality of touch sensing lines traverses the corresponding one of the plurality of common electrode blocks by overlapping the corresponding one of the plurality of common electrode blocks with the interlayer protective film, the upper planarization layer, and the upper protective film disposed between the remainder of the plurality of touch sensing lines and the corresponding common electrode block.

6. The display device according to claim 1, wherein:
the plurality of pixel electrodes is arranged on the upper planarization layer, and
the plurality of common electrode blocks is arranged on the upper protective film and cover the plurality of pixel electrodes.

7. A method of manufacturing a display device having touch sensors, comprising:
forming a plurality of thin film transistors on a substrate;
forming a lower protective film on drain electrodes of the plurality of thin film transistors, the lower protective film having a plurality of openings overlapping the drain electrodes of the plurality of thin film transistors;
forming a lower planarization layer on the lower protective film, the lower planarization layer having a plurality of openings overlapping the openings of the lower protective film;
forming a plurality of touch sensing lines on the lower planarization layer;
forming an upper planarization layer on the plurality of touch sensing lines and the lower planarization layer, wherein side surfaces of the upper planarization layer cover side surfaces of the lower planarization layer exposed by the plurality of openings of the lower planarization layer, and wherein the side surfaces of the upper planarization, the plurality of openings in the lower planarization layer, and the plurality of openings in the lower protective film form pixel contact holes that expose the drain electrodes of the plurality of thin film transistors;
forming a plurality of pixel electrodes, each of the plurality of pixel electrodes connected to a corresponding one of the plurality of thin film transistors through side surfaces of the pixel contact holes;
forming an upper protective film on the upper planarization layer and the plurality of pixel electrodes; and
forming a plurality of common electrode blocks configured to form an electric field with the plurality of pixel electrodes, each of the plurality of common electrode blocks arranged on the upper protective film to be connected to a corresponding one of the plurality of touch sensing lines,
wherein the upper protective film is arranged between the pixel electrodes and the common electrode blocks; and
wherein the plurality of pixel electrodes contact side surfaces of the upper planarization layer and the lower protective film exposed by the pixel contact holes.

8. The method according to claim 7, further comprising:
forming an interlayer protective film arranged between the touch sensing lines and the upper planarization layer, the interlayer protective film having a plurality of openings overlapping the openings of the plurality of openings of the lower protective film,
wherein side surfaces of the upper planarization layer, the plurality of openings of the interlayer protective film, and the plurality of openings of the lower protective film form the pixel contact holes.

9. The method according to claim 8, wherein each of the upper planarization layer and the lower planarization layer is formed of an organic insulating material, and each of the lower protective film, the interlayer protective film, and the upper protective film is formed of an inorganic insulating material.

10. The method according to claim 8, further comprising forming a plurality of touch contact holes through the interlayer protective film, the upper planarization layer, and the upper protective film to expose the plurality of touch sensing lines,
wherein one of the plurality of touch sensing lines that traverses each of the plurality of common electrode blocks is exposed through one of the plurality of touch contact holes and is connected to a corresponding one of the plurality of common electrode blocks, and
wherein a remainder of the plurality of touch sensing lines traverses the corresponding one of the plurality of common electrode blocks by overlapping the corresponding common electrode block with the interlayer protective film, the upper planarization layer, and the upper protective film disposed between the remainder of the touch sensing lines and the corresponding common electrode block.

11. The method according to claim 9, further comprising:
forming a plurality of touch contact holes through the interlayer protective film, the upper planarization layer, and the upper protective film to expose the plurality of touch sensing lines,
wherein one of the plurality of touch sensing lines that traverses each of the plurality of common electrode blocks is exposed through one of the plurality of touch contact holes and is connected to a corresponding one of the plurality of common electrode blocks, and
wherein a remainder of the plurality of touch sensing lines traverses the corresponding one of the plurality of common electrode blocks by overlapping the corresponding one of the plurality of common electrode blocks with the interlayer protective film, the upper planarization layer, and the upper protective film disposed between the remainder of the touch sensing lines and the corresponding common electrode block.

12. The method according to claim 8, wherein the plurality of openings of the lower protective layer and the plurality of openings of the interlayer protective film are formed through an etching process, wherein the upper planarization layer acts as a mask.

13. A display device having touch sensors comprising:
a substrate;
a thin film transistor (TFT) arranged on the substrate, wherein the TFT includes an electrode;
a first protective film on the TFT, the first protective film including a hole that exposes a portion of an electrode of the TFT;
a first planarization layer over the first protective film and the TFT, the first planarization layer including a hole overlapping the portion of the electrode exposed through the hole in the first protective film;

a touch sensing line (TSL) on the first planarization layer;
a second planarization layer over the TSL and the first planarization layer, the second planarization layer covering a side surface of the first planarization layer exposed by the hole in the first planarization layer such that a hole is formed in the second planarization layer;
an interlayer protective film between the second planarization layer and the TSL arranged on the first planarization layer;
a pixel electrode on the second planarization layer, the pixel electrode electrically connected to the electrode of the TFT through the hole in the second planarization layer, the hole in the first planarization layer, and the hole in the first protective film;
a second protective film on the pixel electrode and the second planarization layer; and
a common electrode block over the pixel electrode the common electrode block electrically connected to the TSL,
wherein at least one of the interlayer protective film and the second protective film is between the common electrode block and the touch sensing line.

14. The display device of claim 13, wherein the pixel electrode is in contact with a side surface of the hole in the second planarization layer.

15. The display device of claim 13, wherein the interlayer protective film covers the side surface of the hole of the first planarization layer.

16. The display device of claim 15, wherein the first protective layer, the interlayer protective film, and the second protective film include inorganic insulating materials.

17. The display device of claim 16, wherein the interlayer protective film reduces oxidation of the TSL.

18. The display device of claim 13, wherein the first planarization layer and the second planarization layer include organic insulating materials.

19. The display device of claim 13, wherein the common electrode block is electrically connected to the TSL through another hole in the second planarization layer.

20. The display device of claim 19, wherein the second protective film is in contact with a side surface of the other hole of the upper planarization layer.

* * * * *